(12) United States Patent
Choi et al.

(10) Patent No.: US 9,087,842 B2
(45) Date of Patent: Jul. 21, 2015

(54) SEMICONDUCTOR DEVICE INCLUDING FUSE STRUCTURE

(71) Applicant: Samsung Electronics Co., Ltd., Suwon-si (KR)

(72) Inventors: Hyun-Min Choi, Uiwang-si (KR); Shigenobu Maeda, Seongnam-si (KR); Ji-Hoon Yoon, Seoul (KR); Sung-Man Lim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/304,750

(22) Filed: Jun. 13, 2014

(65) Prior Publication Data

US 2015/0108602 A1    Apr. 23, 2015

(30) Foreign Application Priority Data

Oct. 22, 2013  (KR) ........................ 10-2013-0126135

(51) Int. Cl.
| | | |
|---|---|---|
| H01L 27/10 | (2006.01) | |
| H01L 29/00 | (2006.01) | |
| H01L 23/525 | (2006.01) | |
| H01L 23/522 | (2006.01) | |

(52) U.S. Cl.
CPC ........ *H01L 23/5256* (2013.01); *H01L 23/5226* (2013.01)

(58) Field of Classification Search
CPC ........................ H01L 23/5256; H01L 23/5226

USPC .................................................. 257/209, 529
See application file for complete search history.

(56) References Cited

U.S. PATENT DOCUMENTS

| | | | |
|---|---|---|---|
| 6,613,612 B2 | 9/2003 | Park | |
| 6,753,210 B2 * | 6/2004 | Jeng et al. ..................... | 438/132 |
| 6,787,878 B1 | 9/2004 | Nagai et al. | |
| 8,133,767 B2 | 3/2012 | Yang et al. | |
| 8,159,041 B2 * | 4/2012 | Saitou ........................... | 257/529 |
| 8,421,186 B2 | 4/2013 | Li et al. | |
| 8,426,943 B2 | 4/2013 | Kim | |
| 8,633,707 B2 * | 1/2014 | Filippi et al. .................. | 324/550 |
| 2003/0160324 A1 * | 8/2003 | Dragon et al. ................. | 257/758 |
| 2010/0176483 A1 | 7/2010 | Iguchi | |
| 2012/0249159 A1 | 10/2012 | Filippi et al. | |
| 2013/0176073 A1 * | 7/2013 | Bao et al. ...................... | 327/525 |

FOREIGN PATENT DOCUMENTS

| | | |
|---|---|---|
| JP | 09-069607 A | 3/1997 |
| JP | 2005-044962 A | 2/2005 |
| JP | 2005-136060 A | 5/2005 |
| JP | 2006-228792 A | 8/2006 |
| JP | 2012-054503 A | 3/2012 |

* cited by examiner

*Primary Examiner* — Luan C Thai
(74) *Attorney, Agent, or Firm* — Muir Patent Law, PLLC

(57) ABSTRACT

A semiconductor device includes a substrate having a fuse area and a device area; a fuse structure in an insulating layer of the fuse area, and a wire structure in the insulating layer of the device area. The fuse structure includes a fuse via, a fuse line electrically connected to a top end of the fuse via pattern and extending in a direction. The wire structure includes a wire via, a wire line electrically connected to a top end of the wire via and extending in the first direction. A width in the first direction of the fuse via is smaller than a width in the first direction of the wire via.

18 Claims, 17 Drawing Sheets

SEMICONDUCTOR DEVICE INCLUDING FUSE STRUCTURE

CROSS-REFERENCE TO RELATED APPLICATION

This U.S. non-provisional patent application claims priority under 35 U.S.C. §119 to Korean Patent Application No. 10-2013-0126135, filed on Oct. 22, 2013, in the Korean Intellectual Property Office, the disclosure of which is hereby incorporated by reference in its entirety.

BACKGROUND

The present disclosure relates to semiconductor devices and, more particularly, to a semiconductor device including electrical fuses.

A semiconductor memory device (or a semiconductor chip) formed on a semiconductor substrate is typically electrically tested before its assembly process. Thus, the semiconductor chip may be classified into bad chip or good chip. If the bad chip is incorrectly operated by at least one bad cell thereof, the bad cell is replaced with a redundant cell by a repair process. Predetermined fuses may blow or be programmed through the repair process in order to provide an address of the bad cell to the redundant cell in a write mode and a read mode. Voltages may be applied to both ends of the fuse on which the repair process is performed, thereby confirming whether the fuse blows or not. The fuses may include a laser fuse blown using laser and an electrical fuse blown by applying a voltage thereto. In general, it is desirable to blow a fuse completely and efficiently in order to perform the repair process.

SUMMARY

Embodiments of the disclosure may provide semiconductor devices with an improved fusing performance.

According to example embodiments, a semiconductor device includes: a substrate including a fuse area and a device area; an insulating layer on the substrate; a fuse structure in the insulating layer of the fuse area, the fuse structure including a fuse via pattern electrically connected to a first portion of the substrate through a first conductive layer, a fuse line pattern electrically connected to a top end of the fuse via pattern and extending in a first direction, and a fuse barrier layer surrounding bottom surfaces and sidewalls of the fuse via pattern and the fuse line pattern; and a wire structure in the insulating layer of the device area, the wire structure includes a wire via pattern electrically connected to a second portion of the substrate through a second conductive layer, a wire line pattern electrically connected to a top end of the wire via pattern and extending in the first direction, and a wire barrier layer surrounding bottom surfaces and sidewalls of the wire via pattern and the wire line pattern. A width in the first direction of the fuse via pattern is smaller than a width in the first direction of the wire via pattern.

In some embodiments, the first portion of the fuse line pattern may have a first width in a second direction perpendicular to the first direction, and the second portion of the fuse line pattern may have a second width in the second direction smaller than the first width.

In some embodiments, the first portion of the fuse line pattern may have a first thickness in a vertical direction, and the second portion of the fuse line pattern may have a second thickness in the vertical direction smaller than the first thickness.

In some embodiments, the second portion of the fuse line pattern having the second cross-sectional area may blow in a fusing program operation.

In some embodiments, the wire line pattern may have a uniform cross-sectional area.

In some embodiments, a thickness of the fuse barrier layer is smaller than a thickness of the wire barrier layer.

In some embodiments, each of the fuse via pattern and the fuse line pattern may include copper (Cu), and the wire via pattern and the wire line pattern may include copper (Cu) and at least one selected from a group consisting of manganese (Mn), aluminum (Al), cobalt (Co), silicon (Si), titanium (Ti), germanium (Ge) and cobalt-tungsten-phosphorus (CoWP).

In some embodiments, each of the fuse via pattern and the fuse line pattern may further include at least one selected from a group consisting of manganese (Mn), aluminum (Al), cobalt (Co), silicon (Si), titanium (Ti), germanium (Ge) and cobalt-tungsten-phosphorus (CoWP). In this case, the amount of the at least one selected from the group consisting of Mn, Al, Co, Si, Ti, Ge and CoWP of each of the fuse via and fuse line patterns may be less than that of each of the wire via and wire line patterns.

In some embodiments, the semiconductor device may further include: a fuse capping layer on the fuse line pattern and including a nitride; and a wire capping layer on the wire line pattern and including a copper alloy or a cobalt alloy.

According to other example embodiments, a semiconductor device includes: a substrate including a fuse area and a device area; an insulating layer on the substrate; a fuse structure in the insulating layer of the fuse area, the fuse structure includes a fuse via pattern, a fuse line pattern electrically connected to a top end of the fuse via pattern and extending in a first direction, and a fuse barrier layer surrounding bottom surfaces and sidewalls of the fuse via pattern and the fuse line pattern; and a wire structure in the insulating layer of the device area, the wire structure includes a wire via pattern, a wire line pattern electrically connected to a top end of the wire via pattern and extending in the first direction, and a wire barrier layer surrounding bottom surfaces and sidewalls of the wire via pattern and the wire line pattern. The fuse via pattern and the fuse line pattern may include copper (Cu) and at least one selected from a group consisting of manganese (Mn), aluminum (Al), cobalt (Co), silicon (Si), titanium (Ti), germanium (Ge) and cobalt-tungsten-phosphorus (CoWP), and the wire via pattern and the wire line pattern may include copper (Cu) and at least one selected from a group consisting of manganese (Mn), aluminum (Al), cobalt (Co), silicon (Si), titanium (Ti), germanium (Ge) and cobalt-tungsten-phosphorus (CoWP). The amount of the at least one selected from the group consisting of Mn, Al, Co, Si, Ti, Ge and CoWP of the wire via and line patterns may be greater than that of the fuse via and line patterns.

According to other example embodiments, a semiconductor device includes: a substrate including a fuse area and a device area; an insulating layer on the substrate; a fuse structure in the insulating layer of the fuse area, the fuse structure including a fuse via electrically connected to a first portion of the substrate through a first conductive layer, a fuse line electrically connected to a top end of the fuse via pattern and extending in a first direction, and a fuse barrier layer surrounding bottom surfaces and sidewalls of the fuse via pattern and the fuse line pattern; and a wire structure in the insulating layer of the device area, the wire structure includes a wire via electrically connected to a second portion of the substrate through a second conductive layer, a wire line electrically connected to a top end of the wire via pattern and extending in the first direction, and a wire barrier layer surrounding bottom surfaces and sidewalls of the wire via pattern and the wire line pattern. A first portion of the fuse line has a first thickness in a vertical direction and a second portion of the fuse line has a second thickness in the vertical direction smaller than the first thickness.

In some embodiments, the first portion of the fuse line has a first width in a second direction perpendicular to both the first direction and the vertical direction and the second portion of the fuse line has a second width in the second direction smaller than the first width.

In some embodiments, a thickness of the fuse barrier layer may be smaller than a thickness of the wire barrier layer.

In some embodiments, a width in the first direction of the fuse via may be smaller than a width in the first direction of the wire via.

In some embodiments, a distance in the first direction from one sidewall of the fuse line to one sidewall of the fuse via pattern may be smaller than a distance in the first direction from a corresponding sidewall of the wire line to a corresponding sidewall of the wire via.

In some embodiments, one sidewall of the fuse line and one sidewall of the fuse via may be substantially in the same plane.

In some embodiments, a thickness of the fuse barrier layer may be non-uniform.

According to other example embodiments, the semiconductor device includes: a substrate including a first area and a second area; an insulating layer on the substrate; a fuse structure in the insulating layer of the first area, the fuse structure includes a fuse via extending vertically away from the substrate and electrically connected to a first portion of the substrate through a first conductive layer, and a fuse line electrically connected to a top end of the first via pattern and extending in a first direction; and a wire structure in the insulating layer of the second area, the wire structure includes a wire via extending vertically away from the substrate and electrically connected to a second portion of the substrate through a second conductive layer, and a wire line electrically connected to a top end of the wire via and extending in the first direction. A width in the first direction of the fuse via is smaller than a width in the first direction of the wire via.

In some embodiments, a first portion of the fuse line has a first width in a second direction perpendicular to the first direction, and a second portion of the fuse line may have a second width in the second direction smaller than the first width.

In some embodiments, the first portion of the fuse line has a first thickness in the vertical direction, and the second portion of the fuse line may have a second thickness in the vertical direction smaller than the first thickness.

BRIEF DESCRIPTION OF THE DRAWINGS

Exemplary embodiments will become more apparent in view of the attached drawings and accompanying detailed description.

DETAILED DESCRIPTION OF THE EMBODIMENTS

Figure 1A:
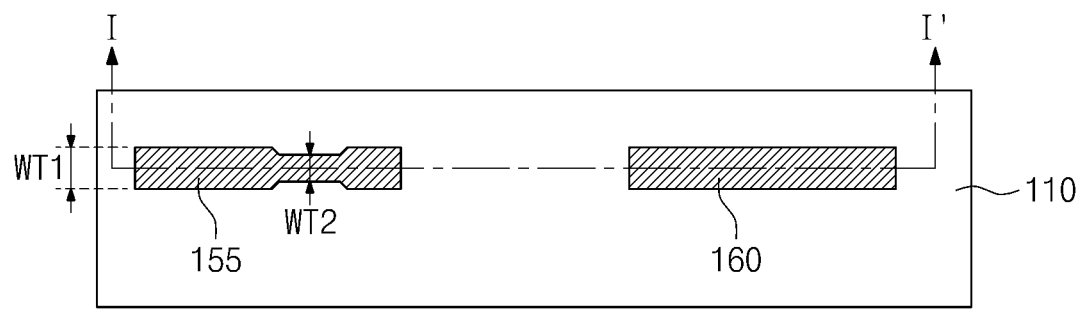
FIG. 1A is an exemplary plan view illustrating a semiconductor device according to an embodiment.

Exemplary embodiments will now be described more fully hereinafter with reference to the accompanying drawings. The advantages and features of the disclosure and methods of achieving them will be apparent from the following exemplary embodiments that will be described in more detail with reference to the accompanying drawings. It should be noted, however, that the disclosed embodiments are not limited to the following exemplary embodiments, and may be implemented in various forms. In the drawings, embodiments of the disclosure are not limited to the specific examples provided herein and are exaggerated for clarity.

The terminology used herein is for the purpose of describing particular embodiments only and is not intended to limit the disclosure. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the disclosure. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present invention. Exemplary embodiments of aspects of the present disclosure explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless the context indicates otherwise, terms such as "thickness," "width," and "length" are relative and may be used to refer to different dimensions in different contexts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1B:
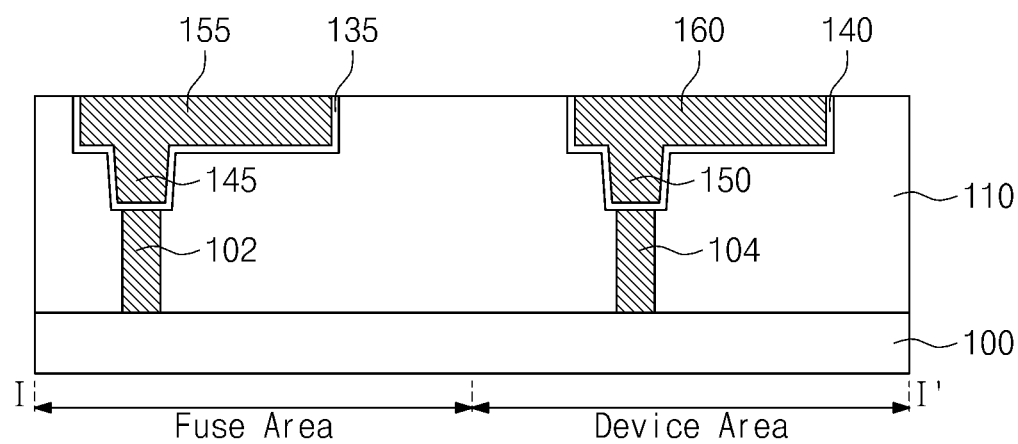
FIG. 1B is an exemplary cross-sectional view taken along a line I-I' of FIG. 1A.
Figure 1C:
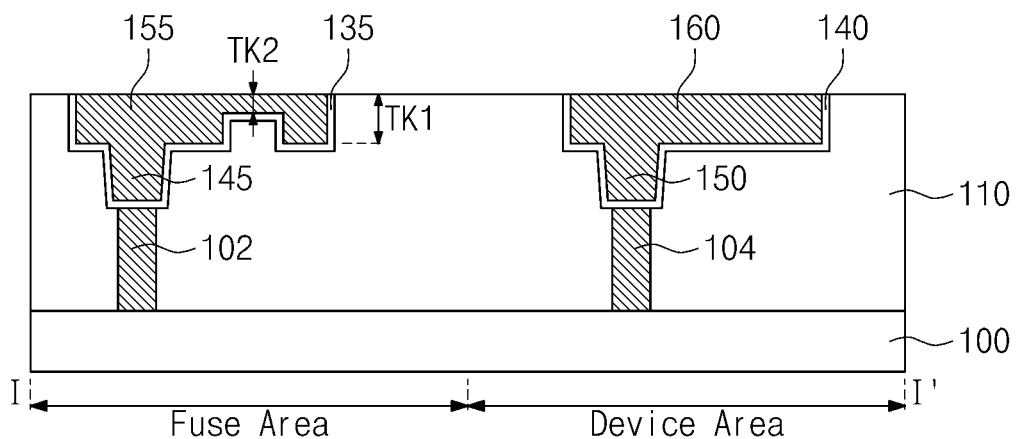
FIG. 1C is another exemplary cross-sectional view taken along a line I-I' of FIG. 1A according to an embodiment.

FIG. 1A is an exemplary plan view illustrating a semiconductor device according to an embodiment. FIG. 1B is an exemplary cross-sectional view taken along a line I-I' of FIG. 1A. FIG. 1C is anther exemplary cross-sectional view taken along a line I-I' of FIG. 1A according to an embodiment.

Referring to FIGS. 1A through 1C, a semiconductor device may include a substrate 100, an insulating layer 110, a fuse structure, and a wire structure.

The substrate 100 may include a fuse area and a device area. A first lower structure 102 (e.g., a first conductive layer) may be disposed on the fuse area of the substrate 100, and a second lower structure 104 (e.g., a second conductive layer) may be disposed on device area of the substrate 100. The first lower structure 102, for example, a conductive layer may be electrically connected to the fuse structure, and the second lower structure 104, for example, a conductive layer may be electrically connected to the wire structure.

The insulating layer 110 may be disposed to cover the first and second conductive layers 102 and 104. The insulating layer 110 may include, for example, an oxide, a nitride, and/or an oxynitride. The fuse structure and the wire structure may be disposed in the insulating layer 110.

The fuse structure may include a fuse barrier layer 135, a fuse via pattern 145, and a fuse line pattern 155. The fuse structure may be used to replace a bad cell with a redundant cell by, for example, blowing the fuse structure in a repair process of the semiconductor device.

A top surface of the fuse line pattern 155 may be disposed at a substantially same level as a top surface of the insulating layer 110. As such, the top surface of the fuse line pattern 155 may be substantially coplanar with the top surface of the insulating layer 110. In some embodiments, the fuse line pattern 155 may include a first portion having a first cross-sectional area (when viewed from a plan view) and a second portion having a second cross-sectional area (when viewed from a plan view) smaller than the first cross-sectional area. According to an embodiment illustrated in FIGS. 1A and 1B, the fuse line pattern 155 may extend in a first direction. The first portion of the fuse line pattern 155 may have a first width WT1 in a second direction perpendicular to both the first direction and a vertical direction, and the second portion of the fuse line pattern 155 may have a second width WT2 in the second direction smaller than the first width WT1. Thus, the first portion of the fuse line pattern 155 may have the first cross-sectional area and the second portion of the fuse line pattern 155 may have the second cross-sectional area. In one embodiment, for segments of the first portion and second portion having the same length in the first direction, the segment of the first portion has a larger cross-sectional area than the segment of the second portion. In one embodiment, a thickness in the vertical direction of the first portion of the fuse line pattern 155 may be substantially equal to a thickness in the vertical direction of the second portion of the fuse line pattern 155, as illustrated in FIG. 1B.

According to an embodiment illustrated in FIG. 1C, a first portion of the fuse line pattern 155 may have a first thickness TK1 in a vertical direction and a second portion of the fuse line pattern 155 may have a second thickness TK2 in the vertical direction smaller than the first thickness TK1. Thus, the first portion having the first thickness TK1 of the fuse line pattern 155 may have a first cross-sectional area, and the second portion having the second thickness TK2 of the fuse line pattern 155 may have a second cross-sectional area less than the first cross-sectional area (e.g., for the entire portions, or for segments of the two partitions having the same length in the first direction). In some embodiments, the first portion having the first thickness TK1 may have a substantially same width as the second portion having the second thickness TK2 (e.g., in a direction perpendicular to both the first direction and the height). In other embodiments, the width of the first portion having the first thickness TK1 may be greater than the width of the second portion having the second thickness TK2.

The fuse via pattern 145 may extend downward from a portion of a bottom surface of the fuse line pattern 155 and connect to a conductive layer 102 contacting a portion of the substrate 100. The fuse via pattern 145 may be spaced apart from the second portion having the second cross-sectional area of the fuse line pattern 155. Thus, in one embodiment, the fuse via pattern 145 does not overlap with the second portion having the second cross-sectional area of the fuse line pattern 155. For example, the fuse via pattern 145 may be disposed to be adjacent to one end of the fuse line pattern 155. In some embodiments, the fuse line pattern 155 and the fuse via pattern 145 may be in one united body. In some embodiments, the fuse via pattern 145 may be a self-aligned via pattern of the fuse line pattern 155.

In some embodiments, the fuse via pattern 145 and the fuse line pattern 155 may include a metal such as copper. In other embodiments, the fuse via pattern 145 and the fuse line pattern 155 may further include at least one selected from a group consisting of manganese (Mn), aluminum (Al), cobalt (Co), silicon (Si), titanium (Ti), germanium (Ge), and cobalt-tungsten-phosphorus (CoWP).

The fuse barrier layer 135 may be disposed between the fuse via pattern 145 and the first conductive layer 102. The fuse barrier layer 135 may extend from between the fuse via pattern 145 and the first conductive layer 102 to surround bottom surfaces of the fuse via pattern 145 and the fuse line pattern 155. In other words, the fuse barrier layer 135 may extend to be disposed between the insulating layer 110 and the fuse via and fuse line patterns 145 and 155. The fuse barrier layer 135 may include, for example, tantalum/tantalum nitride (Ta/TaN), titanium/titanium nitride (Ti/TiN), or tungsten nitride (WN).

The wire structure may include a wire barrier layer 140, a wire via pattern 150, and a wire line pattern 160. The wire structure may be used to provide signals (e.g., addresses, commands, data, or clocks, etc.) and/or voltages (VDD, VSS, VPP, Vint, or Vneg, etc.) for operation of the semiconductor device.

A top surface of the wire line pattern 160 may be disposed at a substantially same level as the top surface of the insulating layer 110. As such, the top surface of the wire line pattern 160 may be substantially coplanar with the top surface of the insulating layer 110. According to an embodiment illustrated in FIGS. 1A and 1B, the wire line pattern 160 may extend in a first direction. In some embodiments, the wire line pattern 160 may have a uniform cross-sectional area (e.g., as viewed from a plan view). The wire line pattern 160 may extend with a uniform width in a second direction perpendicular to the first direction. For example, the wire line pattern 160 may have the first width WT1. Alternatively, the wire line pattern 160 may have a width greater than the first width WT1. In some embodiments, the wire line pattern 160 may have a uniform thickness (e.g., in a vertical direction). For example, the wire line pattern 160 may have the first thickness TK1. Alternatively, the wire line pattern 160 may have a thickness greater than the first thickness TK1.

The wire via pattern 150 may extend downward from a portion of a bottom surface of the wire line pattern 160 and connect to a conductive layer 104 contacting a portion of the substrate 100. For example, the wire line pattern 150 may be disposed to be adjacent to one end of the wire line pattern 160. In some embodiments, the wire line pattern 160 and the wire via pattern 150 may be in one united body. In some embodiments, the wire via pattern 150 may be a self-aligned via pattern of the wire line pattern 160.

In some embodiments, each of the wire via pattern 150 and the wire line pattern 160 may include copper (Cu) and at least one selected from a group consisting of manganese (Mn), aluminum (Al), cobalt (Co), silicon (Si), titanium (Ti), germanium (Ge), and cobalt-tungsten-phosphorus (CoWP). In some embodiments, the amount of manganese (or one of Al, Co, Si, Ti, Ge and CoWP) of each of the wire via pattern 150 and wire line pattern 160 may be greater than the amount of manganese (or one of Al, Co, Si, Ti, Ge and CoWP) of each of the fuse via pattern 145 and fuse line pattern 155.

As described above, a portion of the fuse line pattern 155 has the cross-sectional area smaller than that of another portion of the fuse pattern 155 such that an electro-migration characteristic of the portion of the fuse line pattern 155 may be weakened when a current greater than a set current is applied in a fusing program operation. Thus, the fuse structure may be easily fused as compared with the wire structure. Additionally, a fused position may be limited to the portion of the fuse line pattern 155 such that fusing performance may be improved.

FIGS. 2A, 2B and 2D through 2H are cross-sectional views illustrating a method of manufacturing a semiconductor device according to example embodiments. FIG. 2C is a plan view illustrating a reticle for forming a first mask of FIG. 2B.

Figure 2A:
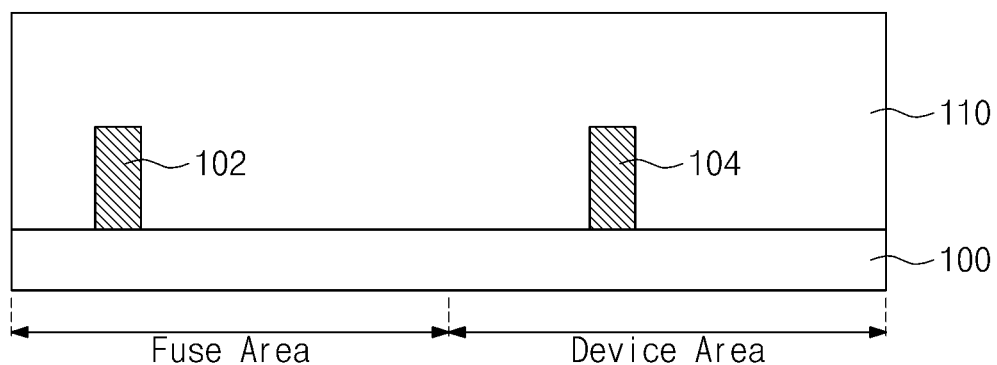
FIGS. 2A, 2B and 2D through 2H are cross-sectional views illustrating a method of manufacturing a semiconductor device according to example embodiments.

Referring to FIG. 2A, first and second lower structures 102 and 104 (e.g., first and second conductive layers) may be formed on a substrate 100. The substrate 100 may include a fuse area and a device area. The first lower structure 102 may be formed on the fuse area and the second lower structure 104 may be formed on the device area.

An insulating layer 110 may be formed to cover the first and second lower structures 102 and 104. The insulating layer 110 may include, for example, an oxide, a nitride, and/or an oxynitride.

Figure 2B:
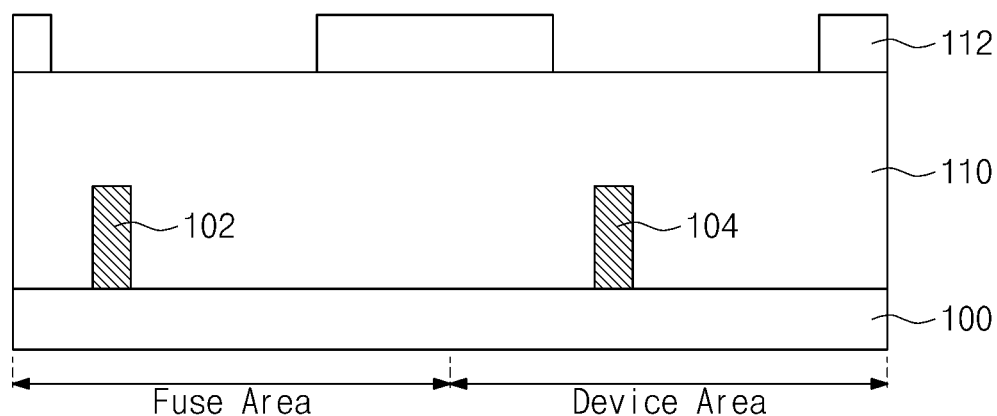
Figure 2C:
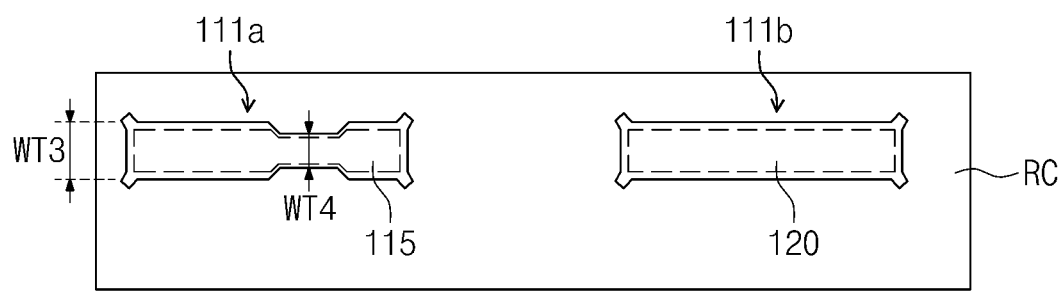
FIG. 2C is a plan view illustrating a reticle for forming a first mask of FIG. 2B.

Referring to FIGS. 2B and 2C, a first mask 112 may be formed on the insulating layer 110.

Hereinafter, a process of forming the first mask 112 will be described briefly.

A photoresist layer (not shown) may be formed on the insulating layer 110. The substrate 100 having the photoresist layer may be loaded into an exposure apparatus. The exposure apparatus may include a reticle and the photoresist layer may be disposed under the reticle. A pattern of the reticle may be reduction-projected to the photoresist layer by using extreme ultraviolet (EUV), X-rays or an ion beam.

In some embodiments, a reticle RC of FIG. 2C may include a first opening 111a for forming a fuse line trench 115 and a second opening 111b for forming a wire line trench 120. Each of the first opening 111a and the second opening 111b may have a linear shape extending in a first direction. Corners of each of the first and second openings 111a and 111b may protrude outward when viewed from a plan view. In some embodiments, the first opening 111a may have a first region having a third width WT3 in a second direction perpendicular to the first direction and a vertical direction and a second region having a fourth width WT4 in the second direction smaller than the third width WT3. The second opening 111b may have a uniform width. The width of the second opening 111b may be substantially equal to or greater than the third width WT3.

The exposed photoresist layer may be formed into a photoresist pattern (not shown) through a developing process and a backing process. A portion exposed by light of the exposed photoresist layer may be removed by the developing process such that the photoresist pattern may have openings corresponding to the first and second openings 111a and 111b of the reticle RC.

In some embodiments, the first mask 112 may include the photoresist pattern. In other embodiments, the first mask 112 may further include a hard mask pattern formed using the photoresist pattern.

Figure 2D:
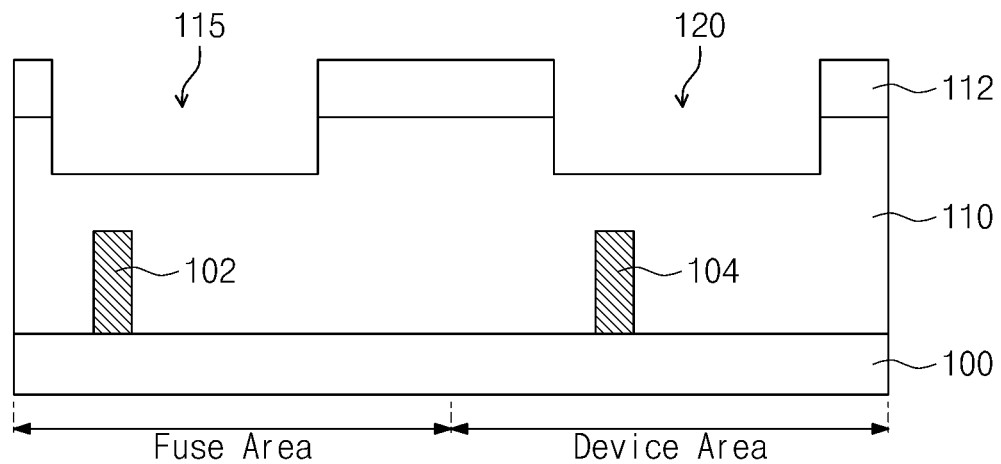

Referring to FIG. 2D, the insulating layer 110 may be etched using the first mask 112 to form the fuse line trench 115 and the wire line trench 120.

In some embodiments, the fuse line trench 115 may have a first portion having the first width WT1 in the second direction and a second portion having the second width WT2 in the second direction smaller than the first width WT1, as illustrated in FIG. 1A. The wire line trench 120 may have a uniform width in the second direction, and the width of the wire line trench 120 may be substantially equal to or greater than the first width WT1.

The first mask 112 may be removed after the formation of the fuse and wire line trenches 115 and 120.

Figure 2E:
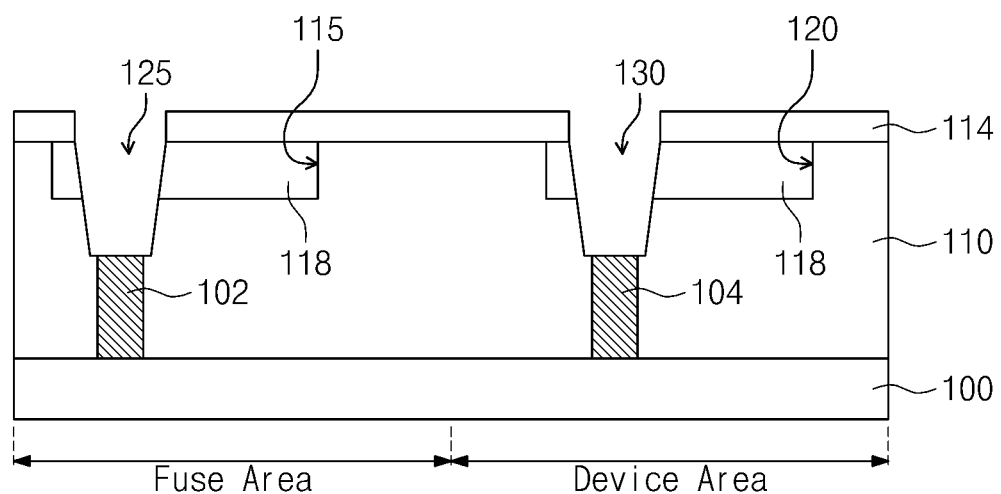

Referring to FIG. 2E, a first sacrificial layer 118 may be formed to fill the fuse line trench 115 and the wire line trench 120. The sacrificial layer 118 and the insulating layer 110 may be patterned to form a fuse via 125 and a wire via 130. The fuse via 125 may be formed in the fuse area, and the wire via 130 may be formed in the device area.

In more detail, a second mask 114 may be formed on the first sacrificial layer 118 and then the first sacrificial layer 118 and the insulating layer 110 may be etched using the second mask 114 to form the fuse via 125 and the wire via 130.

Figure 2F:
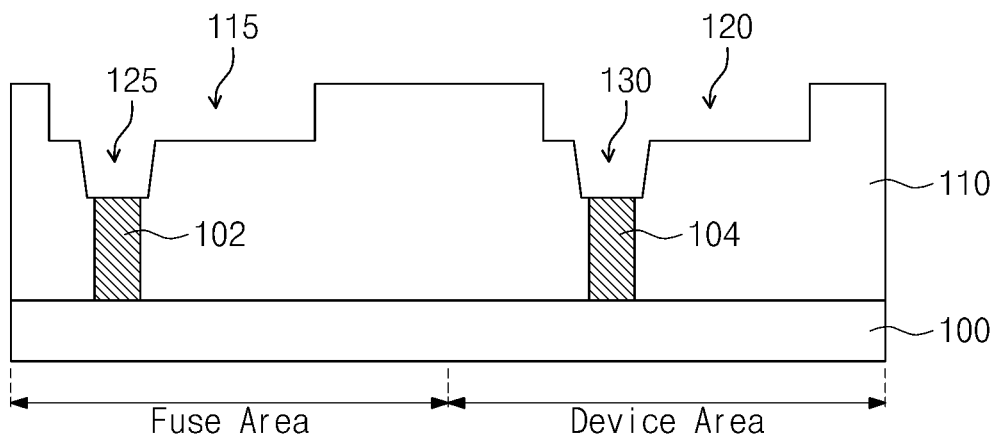

Referring to FIG. 2F, the second mask 114 and the first sacrificial layer 118 may be removed after the formation of the fuse via 125 and the wire via 130. Thus, the fuse via 125 may be connected to the fuse line trench 115 and the wire via 130 may be connected to the wire line trench 120.

Figure 2G:
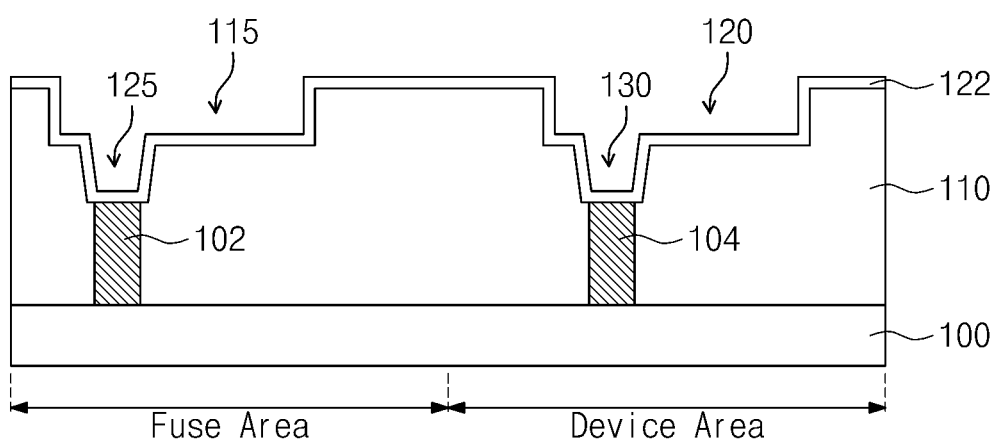

Referring to FIG. 2G, a barrier layer 122 may be conformally formed on the insulating layer 110 in which the fuse via 125, the fuse line trench 115, the wire via 130 and the wire line trench 120 are formed. The barrier layer 122 may include, for example, tantalum/tantalum nitride (Ta/TaN), titanium/titanium nitride (Ti/TiN), or tungsten nitride (WN).

Figure 2H:
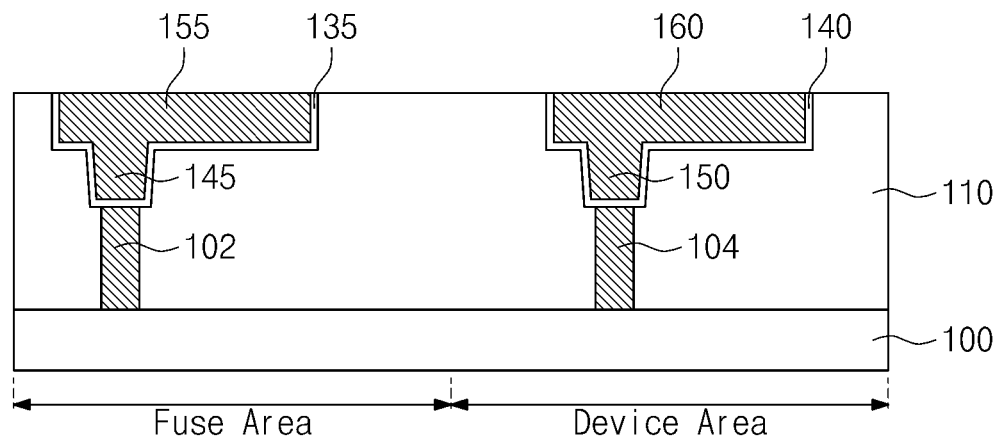

Referring to FIG. 2H, a conductive layer may be formed on the barrier layer 122. The conductive layer may fill the fuse via 125, the fuse line trench 115, the wire via 130 and the wire line trench 120. Subsequently, the conductive layer and the barrier layer 122 may be planarized until the top surface of the insulating layer 110 is exposed, thereby forming a fuse structure in the fuse area and a wire structure in the device area.

In more detail, the fuse structure may include a fuse barrier layer 135, a fuse via pattern 145 and a fuse line pattern 155 that are formed in the fuse area. The wire structure may include a wire barrier layer 140, a wire via pattern 150 and a wire line pattern 160 that are formed in the device area.

Thus, the semiconductor device described with reference to FIGS. 1A and 1B may be manufactured. On the other hand, the semiconductor device of FIG. 1C may be manufactured by a manufacturing method including the method described with reference to FIGS. 2A to 2H and an additional patterning process using a mask.

Figure 3:
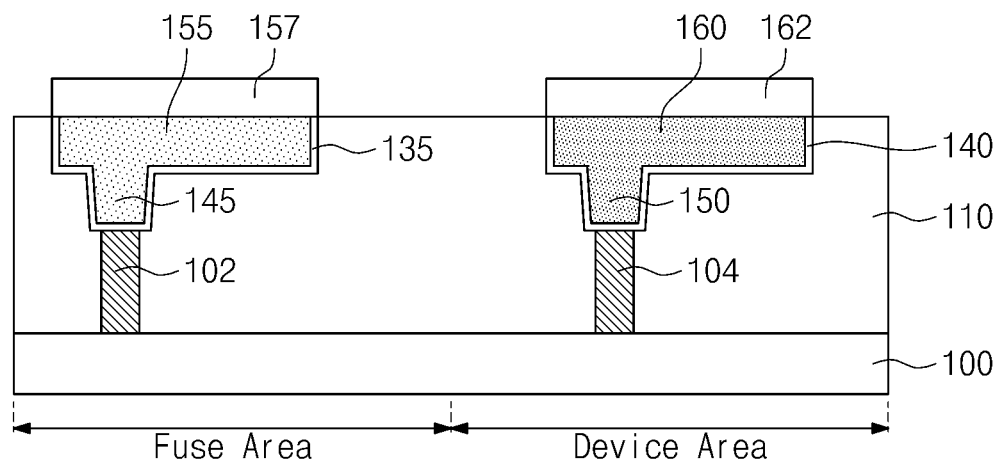
FIG. 3 is an exemplary cross-sectional view illustrating a semiconductor device according to an embodiment.

FIG. 3 is an exemplary cross-sectional view illustrating a semiconductor device according to an embodiment.

Referring to FIG. 3, a semiconductor device may include a fuse structure formed in a fuse area and a wire structure formed in a device area.

The fuse structure may include a fuse barrier layer 135, a fuse via pattern 145, and a fuse line pattern 155. Additionally, the fuse structure may further include a fuse capping layer 157 formed on the fuse line pattern 155. The fuse capping layer 157 may be formed of, for example, a nitride.

The wire structure may include a wire barrier layer 140, a wire via pattern 150, and a wire line pattern 160. Additionally, the wire structure may further include a wire capping layer 162 formed on the wire line pattern 160. The wire capping layer 162 may be formed of, for example, a copper alloy or a cobalt alloy. In some embodiments, the wire capping layer 162 may include, for example, CuSiN, CoWP or CoW. Since the wire capping layer 162 may include the copper alloy or the cobalt alloy, it is possible to suppress electro-migration between the wire capping layer 162 and the wire line pattern 160.

In some embodiments, the fuse via pattern 145 and the fuse line pattern 155 may be in one united body and may include copper (Cu). The wire via pattern 150 and the wire line pattern 160 may be in one united body. Each of the wire via pattern 150 and the wire line pattern 160 may include copper (Cu) and at least one selected from a group consisting of manganese (Mn), aluminum (Al), cobalt (Co), silicon (Si), titanium (Ti), germanium (Ge), and cobalt-tungsten-phosphorus (CoWP).

In other embodiments, each of the fuse via pattern 145 and the fuse line pattern 155 may further include at least one selected from a group consisting of manganese (Mn), aluminum (Al), cobalt (Co), silicon (Si), titanium (Ti), germanium (Ge), and cobalt-tungsten-phosphorus (CoWP), and the amount thereof may be less than that of each of the wire via pattern 150 and the wire line pattern 160.

As described above, since a content of the at least one selected from a group consisting of manganese (Mn), aluminum (Al), cobalt (Co), silicon (Si), titanium (Ti), germanium (Ge), and cobalt-tungsten-phosphorus (CoWP) included in each of the fuse via and line patterns 145 and 155 may be smaller than that of each of the wire via and line patterns 150 and 160 or may not exist, a fusing phenomenon may easily occur at an interface between the fuse via pattern 145 and the fuse capping layer 157 when a current greater than a set current is applied during a fusing program operation. Additionally, the fusing phenomenon may easily occur in the fuse structure as compared with the wire structure such that fusing performance may be improved.

The fuse barrier layer 135, the fuse via pattern 145, the fuse line pattern 155, the wire barrier layer 140, the wire via pattern 150 and the wire line pattern 160 of FIG. 3 may be the same as or similar to the fuse barrier layer 135, the fuse via pattern 145, the fuse line pattern 155, the wire barrier layer 140, the wire via pattern 150 and the wire line pattern 160 of FIGS. 1A and 1B such that the descriptions thereto are omitted.

FIGS. 4A through 4D are cross-sectional views illustrating a method of manufacturing the semiconductor device of FIG. 3 according to example embodiments.

Figure 4A:
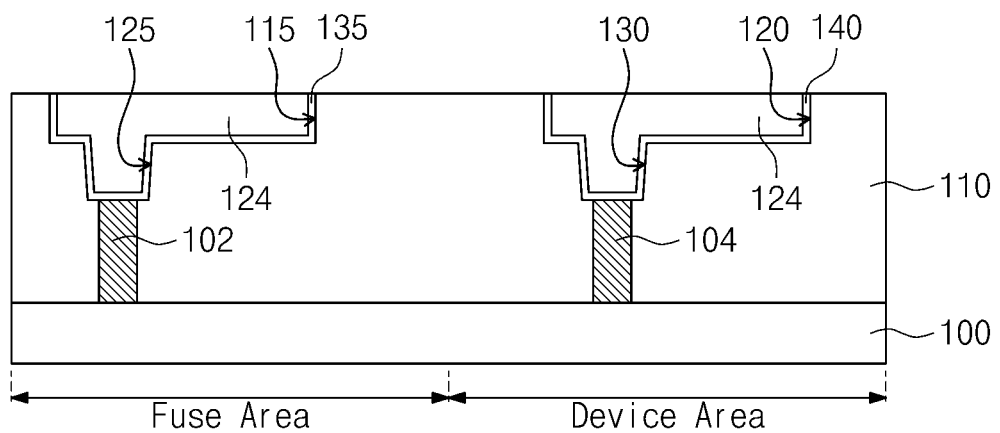
FIGS. 4A to 4D are cross-sectional views illustrating a method of manufacturing the semiconductor device of FIG. 3 according to example embodiments.

Referring to FIG. 4A, a fuse via 125, a fuse line trench 115, a wire via 130 and a wire line trench 120 may be formed in an insulating layer 110. The descriptions to the formation of the vias 125 and 130 and the trenches 115 and 130 may be the same as or similar to the descriptions with reference to FIGS. 2A to 2F. However, a width of the fuse line trench 115 in the present embodiment is not limited to the descriptions of FIGS. 2B, 2C and 2D. Thus, the trenches 115 and 120 of the present embodiment may be formed using a reticle different from the reticle RC of FIG. 2C.

A barrier layer (not shown) may be conformally formed on the insulating layer 110 having the fuse via 125, the fuse line trench 115, the wire via 130 and the wire line trench 120. For example, a sacrificial layer 124 may be formed to fill the fuse via 125, the fuse line trench 115, the wire via 130 and the wire line trench 120 on the barrier layer. The sacrificial layer 124 may be formed of a material having an etch selectivity with respect to the insulating layer 110. The sacrificial layer may include, for example, an oxide, a nitride, and/or an oxynitride layer. In some embodiments, if the insulating layer 110 is formed an oxide, the sacrificial layer 124 may be formed of a nitride.

The sacrificial layer 124 and the barrier layer may be etched until a top surface of the insulating layer 110 is exposed. Thus, a fuse barrier layer 135 may be formed in a fuse area and a wire barrier layer 140 may be formed in a device area.

Figure 4B:
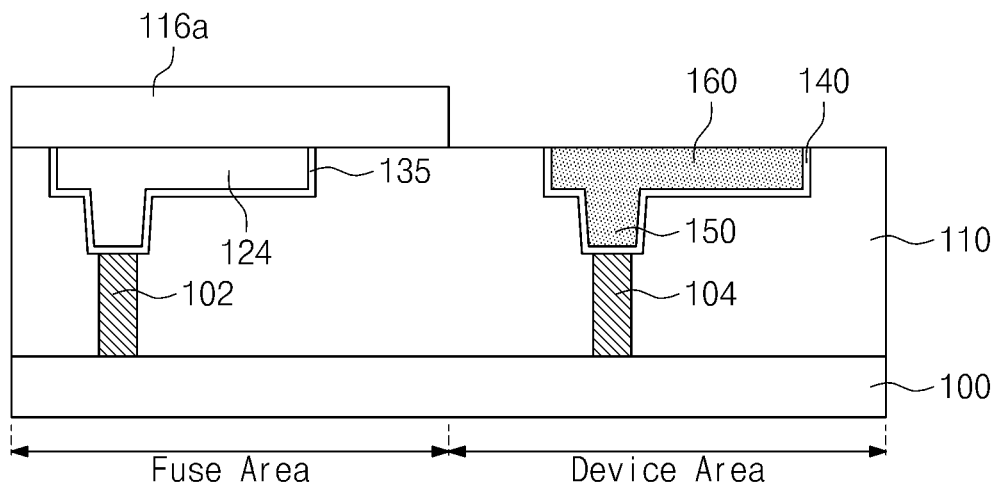

Referring to FIG. 4B, a first mask 116a may be formed to cover the fuse area and the sacrificial layer 124 of the device area may be then removed using the first mask 116a.

A first conductive layer (not shown) may be formed on the wire barrier layer 140 exposed by the removal of the sacrificial layer 124 of the device area. The first conductive layer may fill the wire via 130 and the wire line trench 120 from which the sacrificial layer 124 is removed. In some embodiments, the first conductive layer may include copper (Cu) and at least one selected from a group consisting of manganese (Mn), aluminum (Al), cobalt (Co), silicon (Si), titanium (Ti), germanium (Ge), and cobalt-tungsten-phosphorus (CoWP). The first conductive layer may be formed by an electroplating process.

The first conductive layer may be etched until the top surface of the insulating layer 110 is exposed, thereby forming a wire structure in the device area. The etching process of the first conductive layer may include a chemical mechanical polishing (CMP) process. The wire structure may include a wire via pattern 150 and a wire line pattern 160. The first mask 116a may be removed after the formation of the wire structure.

Figure 4C:
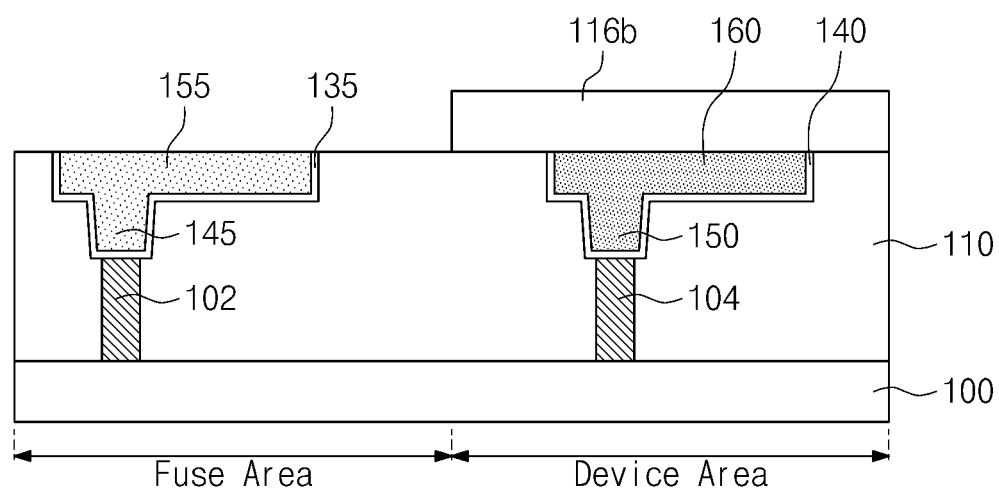

Referring to FIG. 4C, a second mask 116b may be formed to cover the wire structure and the sacrificial layer 124 of the fuse area may be then removed using the second mask 116b.

A second conductive layer (not shown) may be formed to fill the fuse via 125 and the fuse line trench 115 from which the sacrificial layer 124 is removed. The second conductive layer may be formed by an electroplating process. In some embodiments, the second conductive layer may include copper (Cu). In other embodiments, the second conductive layer may further include at least one selected from a group consisting of manganese (Mn), aluminum (Al), cobalt (Co), silicon (Si), titanium (Ti), germanium (Ge), and cobalt-tungsten-phosphorus (CoWP), and the amount thereof may be less than that of the first conductive layer.

The second conductive layer may be etched until the top surface of the insulating layer 110 is exposed, thereby forming a fuse structure in the fuse area. The etching process of the second conductive layer may include a CMP process. The fuse structure may include a fuse via pattern 145 and a fuse line pattern 155. The second mask 116b may be removed after the formation of the fuse structure.

Figure 4D:
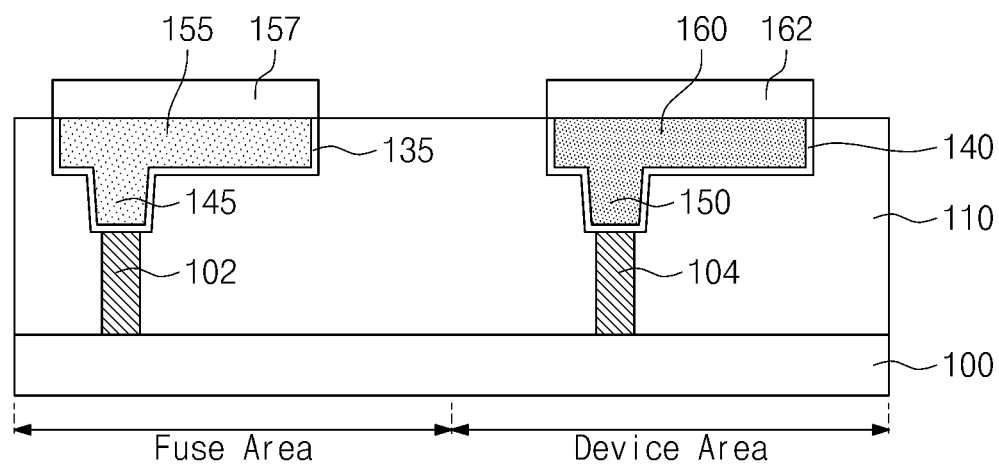

Referring to FIG. 4D, a fuse capping layer 157 may be formed on the fuse line pattern 155 and a wire capping layer 162 may be formed on the wire line pattern 160.

The fuse capping layer 157 may include, for example, silicon nitride (SiN). The wire capping layer 162 may include, for example, a copper alloy or a cobalt alloy. For example, the wire capping layer 162 may include CuSiN, CoWP or CoW.

Figure 5:
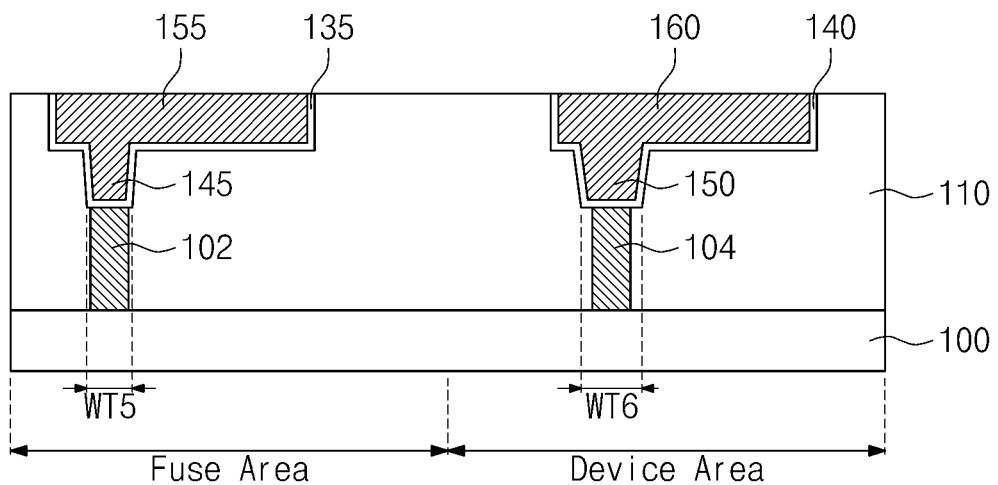
FIG. 5 is an exemplary cross-sectional view illustrating a semiconductor device according to an embodiment.

FIG. 5 is an exemplary cross-sectional view illustrating a semiconductor device according to an embodiment.

Referring to FIG. 5, a semiconductor device may include a fuse structure formed in a fuse area and a wire structure formed in a device area.

The fuse structure may include a fuse barrier layer 135, a fuse via pattern 145, and a fuse line pattern 155 extending in a first direction. The wire structure may include a wire barrier layer 140, a wire via pattern 150, and a wire line pattern 160.

In some embodiments, the fuse via pattern 145 may have a fifth width WT5 in the first direction, and the wire via pattern 150 may have a sixth width WT6 in the first direction greater than the fifth width WT5.

As described above, the width of the fuse via pattern 145 is smaller than the width of wire via pattern 150 such that an electro-migration characteristic of the fuse via pattern 145 may be weak when a current greater than a set current is applied during a fusing program operation. Thus, the fuse structure may be easily fused as compared with the wire structure. Additionally, a fused position may be limited to the fuse via pattern 145 such that fusing performance may be improved.

Other features of the fuse barrier layer 135, the fuse via pattern 145, the fuse line pattern 155, the wire barrier layer 140, the wire via pattern 150 and the wire line pattern 160 of FIG. 5 may be the same as or similar to those of the fuse barrier layer 135, the fuse via pattern 145, the fuse line pattern 155, the wire barrier layer 140, the wire via pattern 150 and the wire line pattern 160 of FIGS. 1A and 1B such that the descriptions thereto are omitted.

FIGS. 6A, 6B, 6D and 6E are cross-sectional views illustrating a method of manufacturing the semiconductor device of FIG. 5 according to example embodiments. FIG. 6C is a plan view illustrating a reticle for forming a mask of FIG. 6B.

Figure 6A:
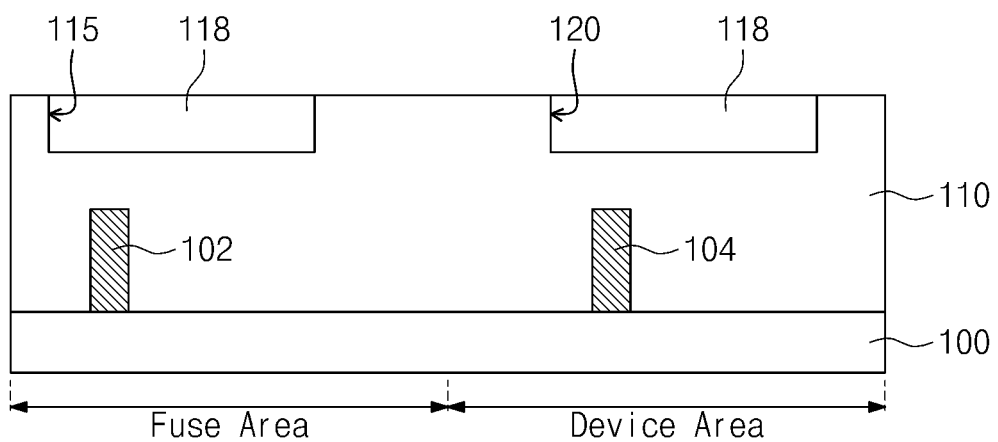
FIGS. 6A, 6B, 6D and 6E are cross-sectional views illustrating a method of manufacturing the semiconductor device of FIG. 5 according to example embodiments.

Referring to FIG. 6A, an insulating layer 110 may be formed on a substrate 100 having first and second lower structures 102 and 104 and then a fuse line trench 115 and a wire line trench 120 may be formed in the insulating layer 110. A sacrificial layer 118 may be formed to fill the fuse line trench 115 extending in a first direction and the wire line trench 120 extending in the first direction. These processes described with reference to FIG. 6A according to the present embodiment may be substantially the same as or similar to the processes described with FIGS. 2A to 2D. Thus, the descriptions to these processes of the present embodiment are omitted. However, a width in a second direction perpendicular to both the first direction and a vertical direction of the fuse line trench 115 of the present embodiment is not limited to that of the fuse line trench 115 described with reference to FIGS. 2B to 2D. Thus, a reticle having a different structure from the reticle RC of FIG. 2C may be used in the present embodiment.

Figure 6B:
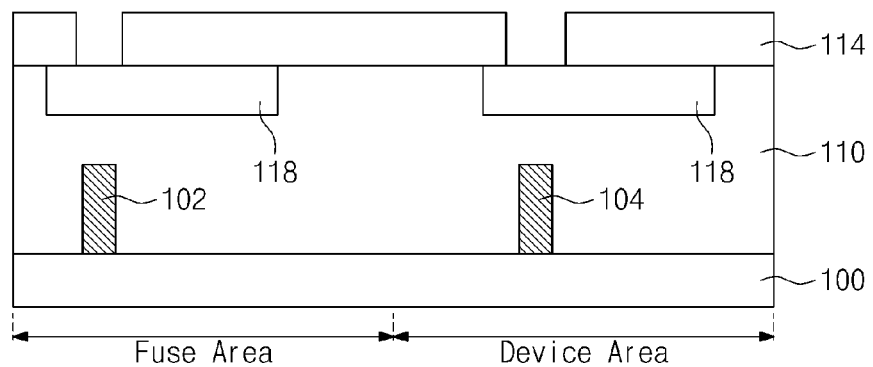
Figure 6C:
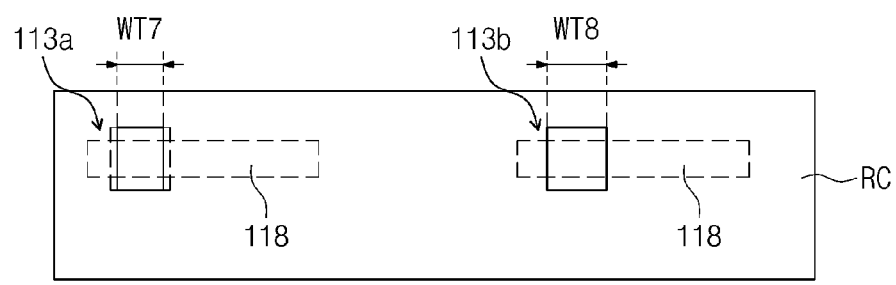
FIG. 6C is a plan view illustrating a reticle for forming a mask of FIG. 6B.

Referring to FIGS. 6B and 6C, a mask 114 may be formed on the sacrificial layer 118.

Hereinafter, a process of forming the mask 114 will be described briefly.

A photoresist layer (not shown) may be formed on the sacrificial layer 118 and the insulating layer 110. The substrate 100 having the photoresist layer may be loaded into an exposure apparatus. The exposure apparatus may include a reticle RC. The exposure apparatus may reduction-project a pattern of the reticle RC to the photoresist layer.

In some embodiments, a reticle RC of FIG. 6C may include a third opening 113a for forming a fuse via 125 and a fourth opening 113b for forming a wire via 130. A width WT7 in the first direction of the third opening 113a may be smaller than a width WT8 in the first direction of the fourth opening 113b in order that the fuse via 125 has the width smaller than that of the wire via 130 as described with reference to FIG. 5. At this time, the widths WT7 and WT8 of the openings 113a and 113b may be parallel to a longitudinal direction of the fuse line trench 115.

The exposed photoresist layer may be formed into a photoresist pattern (not shown) through a developing process and a backing process. A portion exposed by light of the exposed photoresist layer may be removed by the developing process such that the photoresist pattern may have openings corresponding to the openings 113a and 113b of the reticle RC.

In some embodiments, the mask 114 may include the photoresist pattern. In other embodiments, the mask 114 may further include a hard mask pattern formed using the photoresist pattern.

Figure 6D:
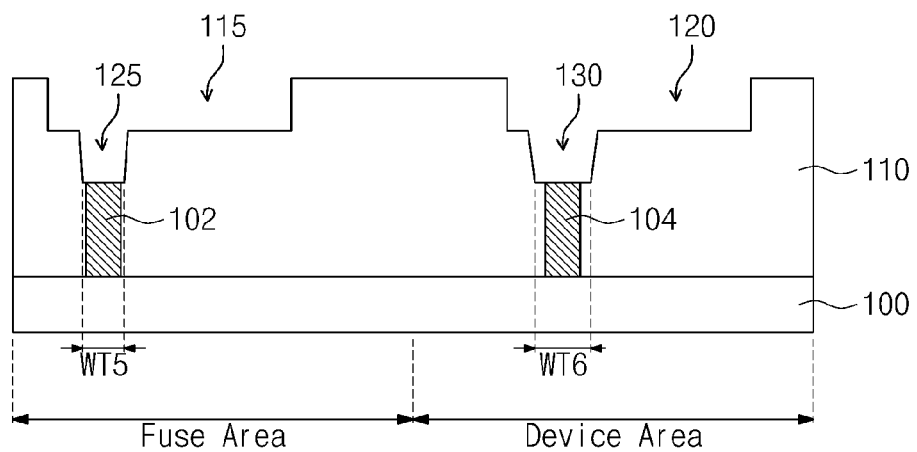

Referring to FIG. 6D, the sacrificial layer 118 and the insulating layer 110 may be etched using the mask 114 to form the fuse via 125 and the wire via 130. In some embodiments, the fuse via 125 may have a fifth width WT5 and the wire via 130 may have a sixth width WT6 greater than the fifth width WT6.

The mask 114 and the sacrificial layer 118 may be removed after the formation of the fuse and wire vias 125 and 130. Thus, the fuse via 125 may be connected to the fuse line trench 115 and the wire via 130 may be connected to the wire line trench 120.

Figure 6E:
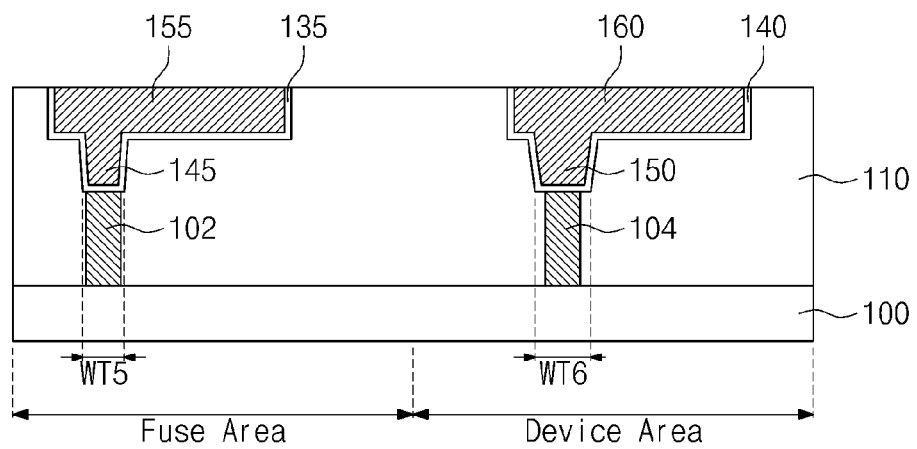

Referring to FIG. 6E, a barrier layer (not shown) may be conformally formed on the insulating layer 110 having the fuse via 125, the fuse line trench 115, the wire via 130 and the wire line trench 120. Subsequently, a conductive layer (not shown) may be formed to fill the fuse via 125, the fuse line trench 115, the wire via 130 and the wire line trench 120 on the barrier layer. The conductive layer and the barrier layer may be planarized or polished until the top surface of the insulating layer 110 is exposed, thereby forming a fuse structure in the fuse area and a wire structure in the device area.

In more detail, the fuse structure may include a fuse barrier layer 135, a fuse via pattern 145 and a fuse line pattern 155. The wire structure may include a wire barrier layer 140, a wire via pattern 150 and a wire line pattern 160.

Figure 7A:
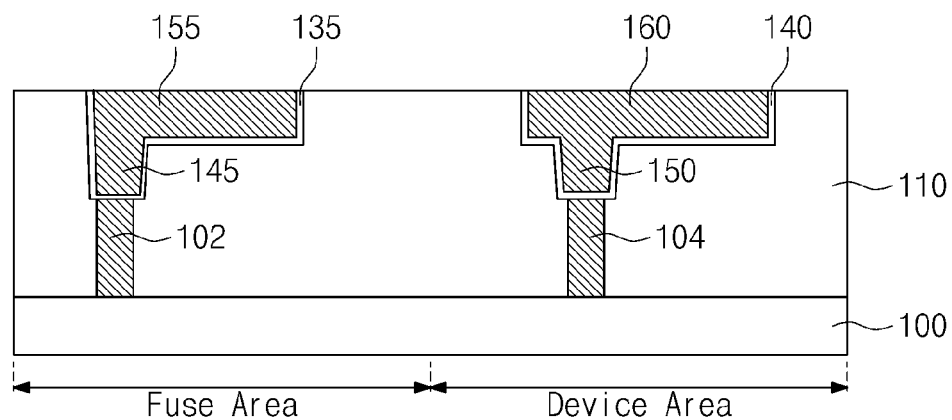
FIGS. 7A and 7B are cross-sectional views illustrating semiconductor devices according to example embodiments.
Figure 7B:
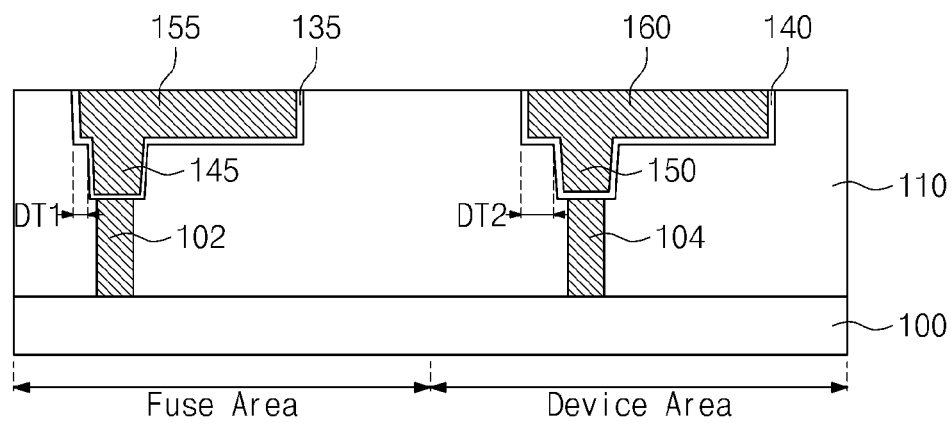

FIGS. 7A and 7B are cross-sectional views illustrating semiconductor devices according to example embodiments.

Referring to FIGS. 7A and 7B, a semiconductor device may include a fuse structure formed in a fuse area and a wire structure formed in a device area.

The fuse structure may include a fuse barrier layer 135, a fuse via pattern 145 and a fuse line pattern 155 extending a first direction. The wire structure may include a wire barrier layer 140, a wire via pattern 150 and a wire line pattern 160 extending in the first direction.

In some embodiments, a thickness of the fuse barrier layer 135 may not be uniform. In particular, a thickness of the fuse barrier layer adjacent to the fuse via pattern 145 may not be uniform.

According to an embodiment illustrated in FIG. 7A, one sidewall of the fuse line pattern 155 may be substantially coplanar with one sidewall of the fuse via pattern 145.

According to an embodiment illustrated in FIG. 7B, a distance DT1 in the first direction from one sidewall (e.g., a left sidewall) of the fuse line pattern 155 to one sidewall (e.g., a left sidewall) of the fuse via pattern 145 may be shorter than a distance DT2 in the first direction from a corresponding sidewall (e.g., a left sidewall) of the wire line pattern 160 to a corresponding sidewall (e.g., a left sidewall) of the wire via pattern 150.

As described above, in the event that the sidewalls of the fuse line and fuse via patterns 155 and 145 are disposed in the same plane or the distance DT1 from the one sidewall of the fuse line pattern 155 to the one sidewall of the fuse via pattern is shorter, the thickness of the fuse barrier layer 135 may not be uniform. This will be described in more detail later.

Since the thickness of the fuse barrier layer 135 is not uniform, the fuse via pattern 145 may be easily fused when a current greater than a set current is applied in a fusing program operation. Additionally, the fused position may be limited to the fuse via pattern 145 such that the fusing performance of the semiconductor device may be improved.

Other features of the fuse barrier layer 135, the fuse via pattern 145, the fuse line pattern 155, the wire barrier layer 140, the wire via pattern 150 and the wire line pattern 160 of FIGS. 7A and 7B according to the present embodiment may be the same as or similar to those of the fuse barrier layer 135, the fuse via pattern 145, the fuse line pattern 155, the wire barrier layer 140, the wire via pattern 150 and the wire line pattern 160 of FIGS. 1A and 1B such that the descriptions thereto are omitted.

FIGS. 8A through 8D are cross-sectional views illustrating a method of manufacturing a semiconductor device according to example embodiments.

Figure 8A:
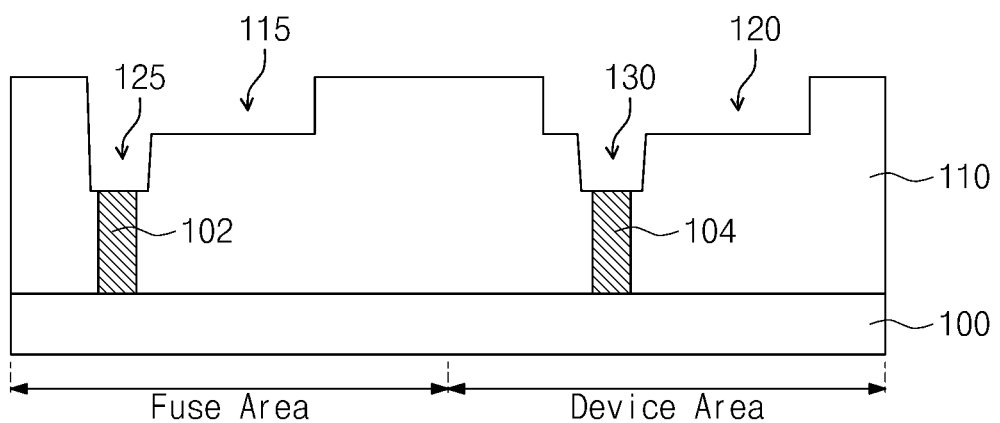
FIGS. 8A through 8D are cross-sectional views illustrating a method of manufacturing a semiconductor device according to example embodiments.

Referring to FIG. 8A, a fuse via 125, a fuse line trench 115, a wire via 130 and a wire line trench 120 may be formed in an insulating layer 110. These processes of FIG. 8A according to the present embodiment may be substantially the same as or similar to the processes described with FIGS. 2A to 2F. However, a width of the fuse line trench 115 of the present embodiment is not limited to that of the fuse line trench 115 described with reference to FIGS. 2B to 2D. Thus, a reticle having a different structure from the reticle RC of FIG. 2C may be used in the present embodiment.

In some embodiments, one sidewall of the fuse via 125 may be substantially coplanar with one sidewall of the fuse line trench 115. In other words, the one sidewalls of the fuse via 125 and the fuse line trench 115 may be substantially in the same plane. In other embodiments, a distance DT1 in the first direction from one sidewall of the fuse line trench 115 to one sidewall of the fuse via 125 may be shorter than a distance DT2 in the first direction from a corresponding sidewall of the wire line trench 120 to a corresponding sidewall of the wire via 130.

Figure 8B:
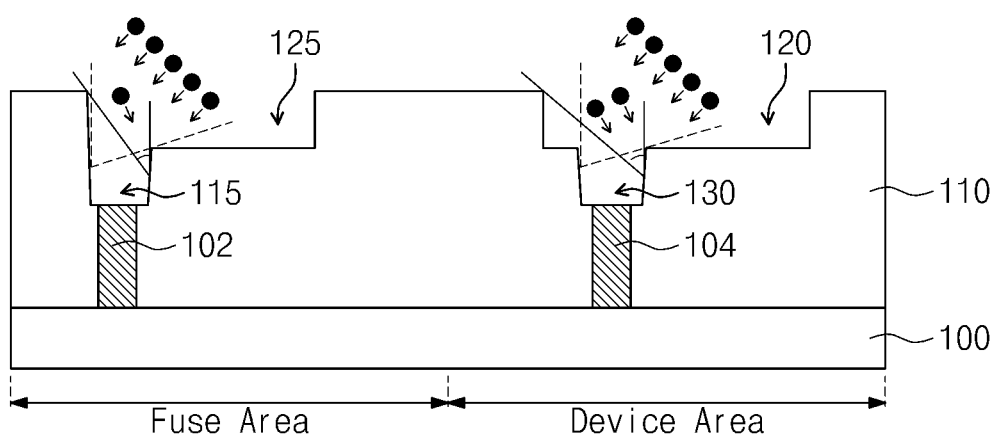
Figure 8C:
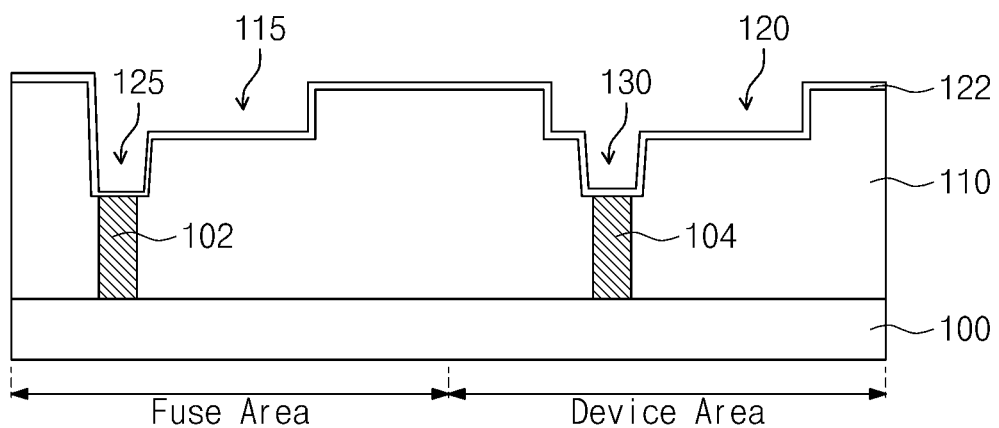

Referring to FIGS. 8B and 8C, a barrier layer 122 may be conformally formed on the insulating layer 110 having the fuse via 125, the fuse line trench 115, the wire via 130 and the wire line trench 120. In some embodiments, the barrier layer 122 may be formed by a sputtering process.

The barrier layer 122 formed in the fuse via and fuse line trench 125 and 115 having the respective sidewalls in the same plane will be described as an example hereinafter.

The sputtering process may be performed on the fuse via 125, the fuse line trench 115, the wire via 130 and the wire line trench 120. The sputtering process may be performed vertically to a top surface of the substrate 100 and/or slantingly to the top surface of the substrate 100 with a predetermined angle.

At this time, the amount of atoms sputtered into the fuse via 125 may be less than the amount of atoms sputtered into the wire via 130 due to a shape between fuse via 125 and the fuse line trench 115 and a shape between the wire via 130 and the wire line trench 120. Since the one sidewalls of the fuse via 125 and the fuse line trench 115 are in the same plane, the amount of the atoms sputtered into the fuse via 125 may be less. Thus, the barrier layer 122 in the fuse via 125 may be thin and the barrier layer 122 in the fuse line trench 115 may be relatively thick.

Figure 8D:
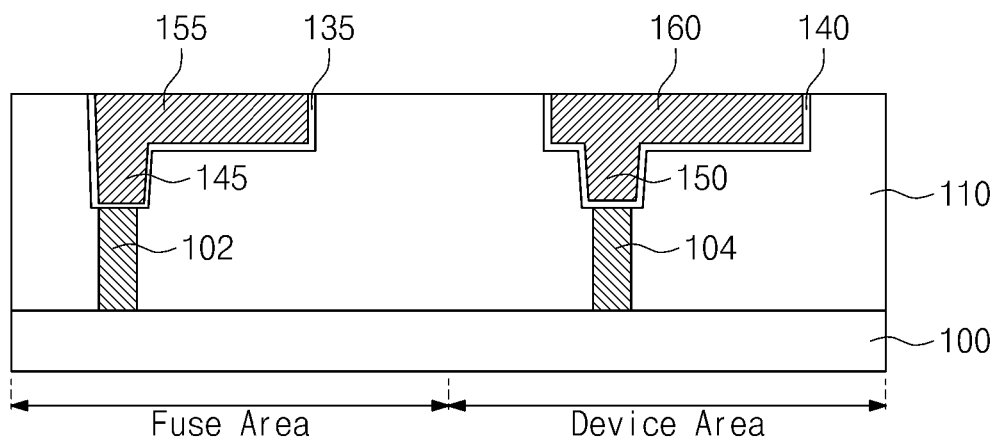

Referring to FIG. 8D, a conductive layer (not shown) may be formed to fill the fuse via 125, the fuse line trench 115, the wire via 130 and the wire line trench 120 on the barrier layer 122. For example, the conductive layer and the barrier layer 122 may be planarized or polished until the top surface of the insulating layer 110, thereby forming a fuse structure in the fuse area and a wire structure in the device area.

In more detail, the fuse structure may include a fuse barrier layer 135, a fuse via pattern 145 and a fuse line pattern 155. The wire structure may include a wire barrier layer 140, a wire via pattern 150 and a wire line pattern 160.

Figure 9:
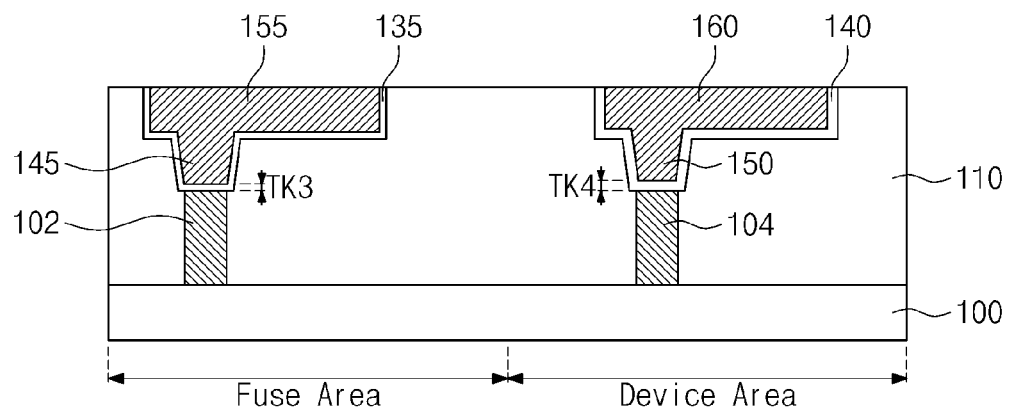
FIG. 9 is an exemplary cross-sectional view illustrating a semiconductor device according to an embodiment.

FIG. 9 is an exemplary cross-sectional view illustrating a semiconductor device according to an embodiment.

Referring to FIG. 9, a semiconductor device may include a fuse structure formed in a fuse area and a wire structure formed in a device area.

The fuse structure may include a fuse barrier layer 135, a fuse via pattern 145 and a fuse line pattern 155 extending in a first direction. The wire structure may include a wire barrier layer 140, a wire via pattern 150 and a wire line pattern 160.

In some embodiments, the fuse barrier layer 135 may have a third thickness TK3 in a vertical direction perpendicular to the first direction. The wire barrier layer 140 may have a fourth thickness TK4 in the vertical direction greater than the third thickness TK3.

Since the fuse barrier layer 135 has the thinner thickness than the wire barrier layer 140, an electro-migration characteristic of the fuse barrier layer 135 may be weak when a current greater than a set current is applied during a fusing program operation. Thus, the fuse structure may be easily fused as compared with the wire structure. Additionally, a fused position may be limited to the fuse barrier layer 135 between the fuse via pattern 145 and a first lower structure 102 such that fusing performance may be improved.

Other features of the fuse barrier layer 135, the fuse via pattern 145, the fuse line pattern 155, the wire barrier layer 140, the wire via pattern 150 and the wire line pattern 160 of FIG. 9 according to the present embodiment may be the same as or similar to those of the fuse barrier layer 135, the fuse via pattern 145, the fuse line pattern 155, the wire barrier layer 140, the wire via pattern 150 and the wire line pattern 160 of FIGS. 1A and 1B such that the descriptions thereto are omitted.

FIGS. 10A to 10E are cross-sectional views illustrating a method of manufacturing the semiconductor device of FIG. 9 according to example embodiments.

Figure 10A:
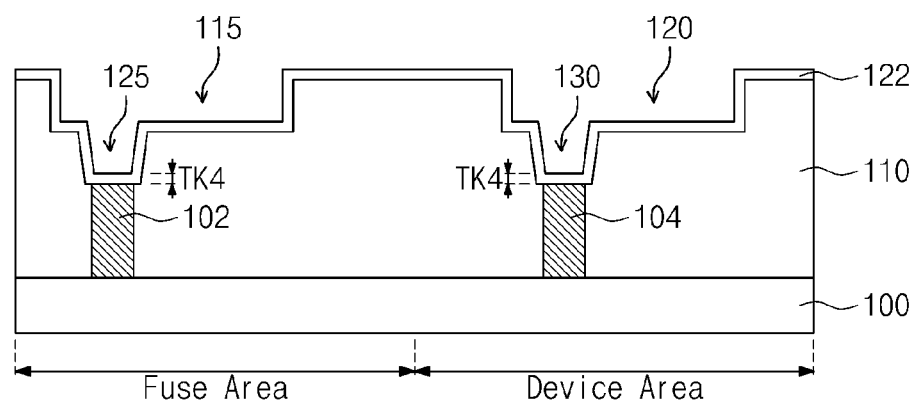
FIGS. 10A through 10E are cross-sectional views illustrating a method of manufacturing the semiconductor device of FIG. 9 according to example embodiments.

Referring to FIG. 10A, a fuse via 125, a fuse line trench 115 extending in a first direction, a wire via 130 and a wire line trench 120 extending in the first direction may be formed in an insulating layer 110. These formation processes of FIG. 10A according to the present embodiment may be substantially the same as or similar to the processes described with FIGS. 2A through 2F. However, a width in a second direction perpendicular to both the first direction and a vertical direction of the fuse line trench 115 of the present embodiment is not limited to that of the fuse line trench 115 described with reference to FIGS. 2B through 2D. Thus, a reticle having a different structure from the reticle RC of FIG. 2C may be used in the present embodiment.

A barrier layer 122 may be conformally formed on the insulating layer 110. In some embodiments, the barrier layer 122 may have the fourth thickness TK4.

Figure 10B:
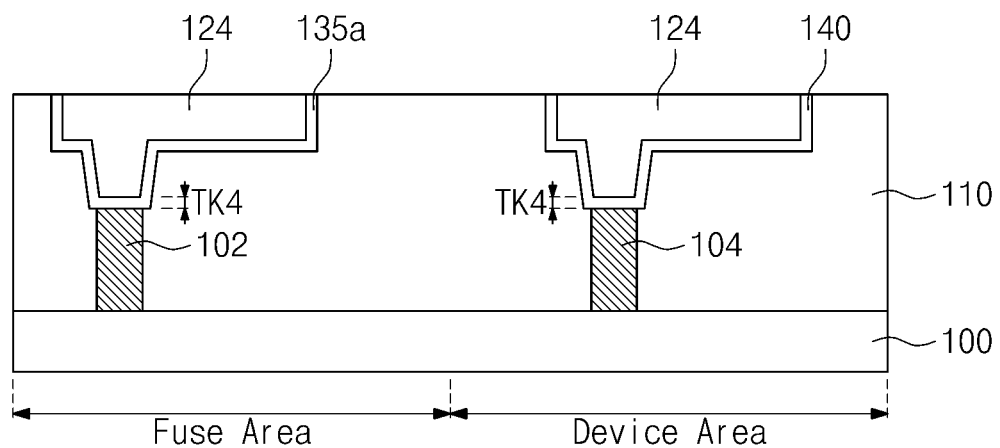

Referring to FIG. 10B, a sacrificial layer 124 may be formed to fill the fuse via 125, the fuse line trench 115, the wire via 130 and the wire line trench 120 on the barrier layer 122.

The sacrificial layer 124 may include, for example, an oxide, a nitride and/or an oxynitride. If the insulating layer 110 includes an oxide, the sacrificial layer 124 may include the nitride.

Subsequently, the sacrificial layer 124 and the barrier layer 122 may be planarized or polished until the top surface of the insulating layer 110 is exposed. Thus, a preliminary fuse barrier layer 135a may be formed in the fuse area and a wire barrier layer 140 may be formed in the device area. Each of the preliminary barrier layer 135a and the wire barrier layer 140 may have the fourth thickness TK4.

Figure 10C:
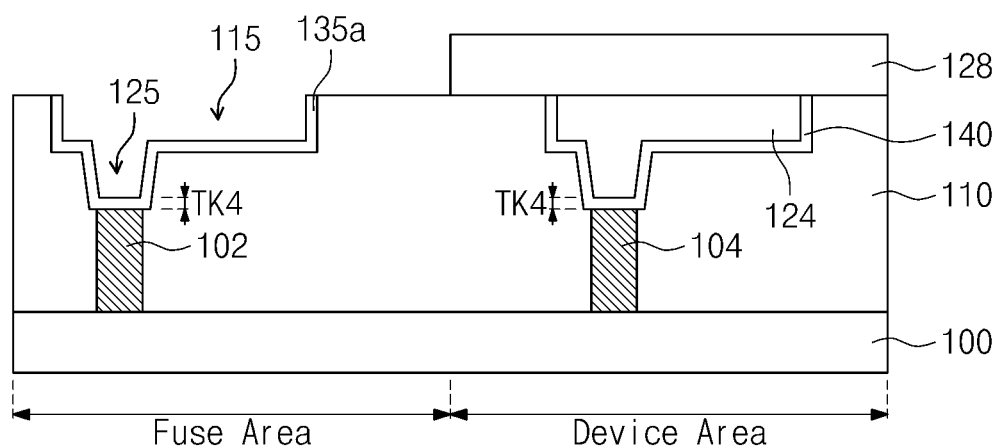

Referring to FIG. 10C, a mask 128 may be formed to correspond to the device area. In other words, the mask 128 may cover the sacrificial layer 124 in the wire via 130 and wire line trench 120. An exposed sacrificial layer 124 of the fuse area may be selectively etched using the mask 128 as an etch mask to expose the preliminary fuse barrier layer 135a.

Figure 10D:
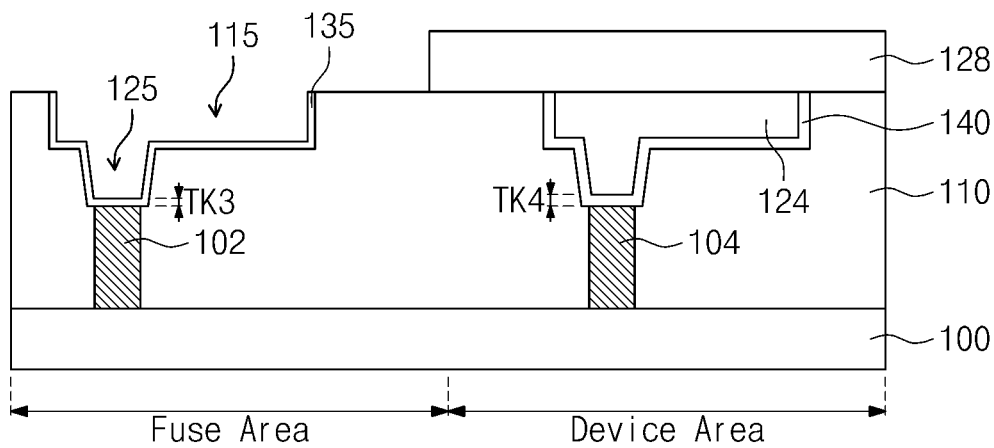

Referring to FIG. 10D, the exposed preliminary fuse barrier layer 135a of the fuse area may be partially etched to form a fuse barrier layer 135. For example, the fuse barrier layer 135 may have the third thickness TK3 less than the fourth thickness TK4.

Figure 10E:
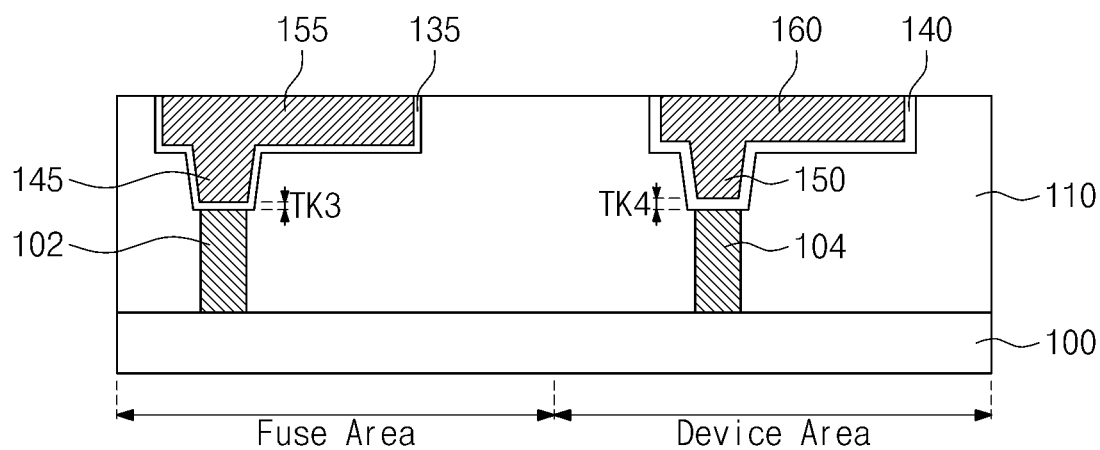

Referring to FIG. 10E, the mask 128 and the sacrificial layer of the device area may be removed and a conductive layer (not shown) may be then formed to fill the fuse via 125, the fuse line trench 115, the wire via 130 and the wire line trench 120 on the fuse barrier layer 135 and the wire barrier layer 140. Next, the conductive layer may be planarized or polished until the top surface of the insulating layer 110 is exposed, thereby forming a fuse structure in the fuse area and a wire structure in the device area.

The fuse structure may include the fuse barrier layer 135, a fuse via pattern 145 and a fuse line pattern 155. The wire structure may include the wire barrier layer 140, a wire via pattern 150 and a wire line pattern 160.

According to various example embodiments, the width or the thickness of the portion of the fuse line pattern may become smaller or the amount of manganese in the fuse line pattern may be controlled to control the fused position in the fuse line pattern. Additionally, the thickness of the fuse barrier layer may become thinner or non-uniform to generate a blowing phenomenon at an adjacent region to the fuse via pattern such that the fused position may be controlled. Thus, the fusing performance of the semiconductor device including the fuse structure may be improved.

According to the disclosed embodiments, the semiconductor device may be, for example, a dynamic random access memory device, such as DDR SDRAM, LPDDR SDRAM, GDDR SDRAM, RDRAM, etc., and a nonvolatile memory device, such as an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

While the disclosure have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the present disclosure are to be determined by the broadest permissible interpretation of the following claims and their equivalents, and shall not be restricted or limited by the foregoing description.

What is claimed is:

1. A semiconductor device comprising:
   a substrate including a fuse area and a device area;
   an insulating layer on the substrate;
   a fuse structure in the insulating layer of the fuse area, the fuse structure including a fuse via pattern electrically connected to a first portion of the substrate through a first conductive layer, a fuse line pattern electrically connected to a top end of the fuse via pattern and extending in a first direction, and a fuse barrier layer surrounding bottom surfaces and sidewalls of the fuse via pattern and the fuse line pattern; and
   a wire structure in the insulating layer of the device area, the wire structure including a wire via pattern electrically connected to a second portion of the substrate through a second conductive layer, a wire line pattern electrically connected to a top end of the wire via pattern and extending in the first direction, and a wire barrier layer surrounding bottom surfaces and sidewalls of the wire via pattern and the wire line pattern,
wherein a width in the first direction of the fuse via pattern is smaller than a width in the first direction of the wire via pattern, and
wherein a thickness of the fuse barrier layer is smaller than a thickness of the wire barrier layer.

2. The semiconductor device of claim 1, wherein the fuse line pattern includes a first portion having a first width in a second direction perpendicular to the first direction, and a second portion having a second width in the second direction smaller than the first width.

3. The semiconductor device of claim 1, wherein the fuse line pattern includes a first portion having a first thickness in a vertical direction, and a second portion having a second thickness in the vertical direction smaller than the first thickness.

4. The semiconductor device of claim 1, wherein the fuse line pattern includes a first portion having a first cross-section area, and a second portion having a second cross-sectional area smaller than the first cross-sectional area,
wherein the second portion blows in a fusing program operation.

5. The semiconductor device of claim 1, wherein each of the fuse via pattern and the fuse line pattern includes copper (Cu), and
wherein each of the wire via pattern and the wire line pattern includes copper (Cu) and at least one selected from a group consisting of manganese (Mn), aluminum (Al), cobalt (Co), silicon (Si), titanium (Ti), germanium (Ge) and cobalt-tungsten-phosphorus (CoWP).

6. The semiconductor device of claim 5, wherein each of the fuse via pattern and the fuse line pattern further includes at least one selected from a group consisting of manganese (Mn), aluminum (Al), cobalt (Co), silicon (Si), titanium (Ti), germanium (Ge) and cobalt-tungsten-phosphorus (CoWP), and
wherein the amount of the at least one selected from the group consisting of Mn, Al, Co, Si, Ti, Ge and CoWP of each of the fuse via and fuse line patterns is less than that of each of the wire via and wire line patterns.

7. The semiconductor device of claim 1, further comprising:
a fuse capping layer on the fuse line pattern and including a nitride; and
a wire capping layer on the wire line pattern and including a copper alloy or a cobalt alloy.

8. A semiconductor device comprising:
a substrate including a fuse area and a device area;
an insulating layer on the substrate;
a fuse structure in the insulating layer of the fuse area, the fuse structure including a fuse via electrically connected to a first portion of the substrate through a first conductive layer, a fuse line electrically connected to a top end of the fuse via and extending in a first direction, and a fuse barrier layer surrounding bottom surfaces and sidewalls of the fuse via and the fuse line; and
a wire structure in the insulating layer of the device area, the wire structure including a wire via electrically connected to a second portion of the substrate through a second conductive layer, a wire line electrically connected to a top end of the wire via pattern and extending in the first direction, and a wire barrier layer surrounding bottom surfaces and sidewalls of the wire via and the wire line,
wherein a first portion of the fuse line has a first thickness in a vertical direction and a second portion of the fuse line has a second thickness in the vertical direction smaller than the first thickness, and
wherein the first portion of the fuse line has a first width in a second direction perpendicular to the first direction and the vertical direction and the second portion of the fuse line has a second width in the second direction smaller than the first width.

9. The semiconductor device of claim 8, wherein a thickness of the fuse barrier layer is smaller than a thickness of the wire barrier layer.

10. The semiconductor device of claim 8, wherein a width in the first direction of the fuse via is smaller than a width in the first direction of the wire via.

11. The semiconductor device of claim 8, wherein a distance in the first direction from one sidewall of the fuse line to one sidewall of the fuse via is smaller than a distance in the first direction from a corresponding sidewall of the wire line to a corresponding sidewall of the wire via.

12. The semiconductor device of claim 8, wherein one sidewall of the fuse line and one sidewall of the fuse via are substantially in the same plane.

13. The semiconductor device of claim 8, wherein a thickness of the fuse barrier layer is non-uniform.

14. A semiconductor device comprising:
a substrate including a first area and a second area;
an insulating layer on the substrate;
a first structure in the insulating layer of the first area, the first structure including a first via extending vertically away from the substrate and electrically connected to a first portion of the substrate through a first conductive layer, and a first line electrically connected to a top end of the first via and extending in a first direction; and
a second structure in the insulating layer of the second area, the second structure including a second via extending vertically away from the substrate and electrically connected to a second portion of the substrate through a second conductive layer, and a second line electrically connected to a top end of the second via and extending in the first direction,
wherein a width in the first direction of the first via is smaller than a width in the first direction of the second via,
wherein a first portion of the first line has a first width in a second direction perpendicular to the first direction, and a second portion of the first line has a second width in the second direction smaller than the first width, and
wherein the first portion of the first line has a first thickness in the vertical direction, and the second portion of the first line has a second thickness in the vertical direction smaller than the first thickness.

15. The semiconductor device of claim 14, wherein the first structure further comprises a first barrier layer surrounding bottom surfaces and sidewalls of the first via, and a second barrier layer surrounding bottom surfaces and sidewalls of the second via, and
wherein a thickness of the first barrier layer is smaller than a thickness of the second barrier layer.

16. The semiconductor device of claim 15, wherein the thickness of the first barrier layer is non-uniform.

17. The semiconductor device of claim 8, wherein the first portion of the fuse line has a first cross-sectional area, and
wherein the second portion of the fuse line has a second cross-sectional area that is configured to blow in a fusing program operation, the second cross-sectional area being smaller than the first cross-sectional area.

18. The semiconductor device of claim 14, wherein the first portion of the first line has a first cross-sectional area, and wherein the second portion of the first line has a second cross-sectional area that is configured to blow in a fusing program operation, the second cross-sectional area being smaller than the first cross-sectional area.

* * * * *